United States Patent [19]
Miller, III et al.

[11] Patent Number: 5,243,282
[45] Date of Patent: Sep. 7, 1993

[54] DETECTOR SYSTEM FOR DETECTING A TARGET MATERIAL IN A SAMPLE

[76] Inventors: Raymond G. Miller, III, 33 S. Westcott Rd.; Raymond A. Feurstein, 1927 Euclid Ave., both of Schenectady, N.Y. 12306

[21] Appl. No.: 906,325

[22] Filed: Jun. 30, 1992

[51] Int. Cl.$^5$ .............................................. G01V 3/00
[52] U.S. Cl. ................................... 324/300; 324/307
[58] Field of Search ............... 324/300, 301, 304, 307, 324/309, 317; 250/281, 282; 422/82.05

[56] References Cited

U.S. PATENT DOCUMENTS

| | | | |
|---|---|---|---|
| 4,514,691 | 4/1985 | De Los Santos et al. | 324/301 |
| 4,988,628 | 1/1991 | Nanji | 250/282 |
| 5,159,617 | 10/1992 | King et al. | 324/307 |
| 5,168,224 | 12/1992 | Maruizumi et al. | 324/300 |

Primary Examiner—Louis Arana
Attorney, Agent, or Firm—Kenyon & Kenyon

[57] ABSTRACT

A detector system for detecting a target material in a sample includes a resonance chamber containing the target for performing magnetic resonance thereon to form dissociated target molecules. A laser is provided for pre-ionizing background material in the resonance chamber and for ionizing the dissociated target molecules. A sensor array detects radiation emitted from the ionized target molecules and a mass spectrometer, which is coupled to the sensor array, analyzes signals from the sensor array to generate a frequency pattern of the target. Electronically stored data tables of known frequency patterns are used for comparing the frequency pattern of the target to the known frequency patterns until a match is determined.

7 Claims, 1 Drawing Sheet

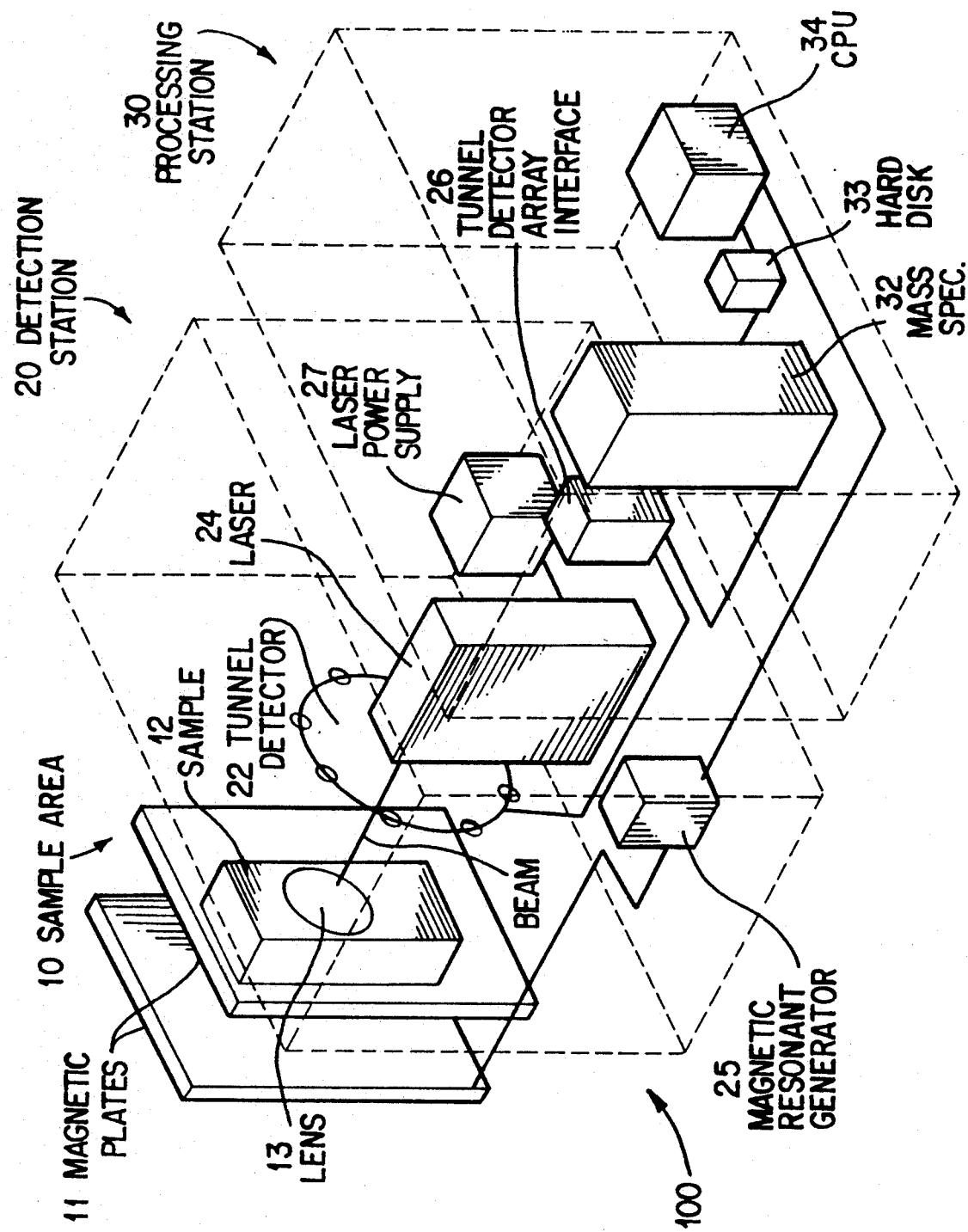

DETECTOR SYSTEM FOR DETECTING A TARGET MATERIAL IN A SAMPLE

BACKGROUND OF THE INVENTION

The invention relates generally to detector systems and more particularly to a detector system for detecting a target material in a sample.

Fieldable laboratory analytical instruments are necessary in order to provide a device to be used in drug interdiction or explosives detection. For example, one of many narcotics that it would be desirable to detect is cocaine. Methods of detection that "sniff" cocaine or detect the presence of cocaine vapor must be capable of detecting very small quantities of the molecule, or else pre-concentrate the vapor by some known technique. Alternatively, a decomposition product of the cocaine can be detected that has a much larger vapor pressure than the cocaine itself. These decomposition products include various carbonyl compounds.

A number of methods are known for detecting such vapors. These methods include the optical techniques of laser photoacoustic detection and ranging, differential absorption LIDAR and thermal infrared emission imagery. Other laser-based techniques include fluorescence spectroscopy, luminescence spectroscopy and fourier transform infrared spectroscopy. Laser photoacoustic detection and ranging, as well as differential absorption LIDAR, are active techniques that require a pulsed-carbon dioxide or other laser with spectral outputs that match the carbonyl absorptions of interest.

A known device used to detect plastic explosives is manufactured by Science Applications International. This detection system irradiates luggage with thermal neutrons, some of which are captured by the atoms of the luggage and its contents. These atoms then emit gamma rays which reveal the chemical structure of the objects irradiated.

All of the above-mentioned techniques have a number of limitations and disadvantages. For example, in some of these techniques the device can only detect those particular targets it has been pre-tuned to detect; it cannot analyze everything that passes through its sample area. Furthermore, some of these devices utilize single mode sensing in which the sample to be analyzed must come to a rest in the sample area, inefficiently slowing down the detection process.

SUMMARY OF THE INVENTION

The invention relates to a detector system for detecting a target material in a sample that overcomes the deficiencies noted above. The detector system includes a resonance chamber containing the target for performing magnetic resonance thereon to form dissociated target molecules. A laser is provided for pre-ionizing background material in the resonance chamber and for ionizing the dissociated target molecules. A sensor array detects radiation emitted from the ionized target molecules. A mass spectrometer coupled to the sensor array analyzes the signals therefrom to generate a frequency pattern of the target. Electronically stored data tables of known frequency patterns are used to compare the frequency pattern of the target to the known frequency patterns until a match is determined.

According to another aspect of the invention, the sensor array includes a superconducting tunnel detector, which provides a number of advantages. For example, tunnel detectors have extremely high sensitivities at wavelengths in the submillimeter and millimeter range. It is at these frequencies that the target molecules de-excite, emitting characteristic radiation by which they can be detected. Furthermore, because of its great sensitivity, the tunnel detector provides the detector system with a degree of versatility not found in the prior art. Hence, a wide variety of sample types may be analyzed. Since the tunnel detector need not be in close proximity to the sample, the sample may be of nearly any size. For example, the sample may range in size from a small vial-sized container to an airplane.

The detection system of the invention also advantageously utilizes cascade technology by integrating a number of diverse technologies. For example, magnetic resonance is advantageously used to assist the laser-induced ionization of the target. The laser, in turn, assists the detection of the emitted radiation by the tunnel detector, and the tunnel detector provides the signals to be analyzed by the mass spectrometer.

The above is a brief description of some of the deficiencies in disclosed detection systems and the advantages of the present invention. Other features, advantages, and embodiments of the invention will be apparent to those skilled in the art from the following description, accompanying drawings and appended claims.

BRIEF DESCRIPTION OF THE DRAWINGS

The sole FIGURE is a schematic diagram illustrating the detector system constructed according to the principles of the invention.

DETAILED DESCRIPTION

FIG. 1 illustrates the detector system 100 of the present invention. This detector system 100 will be described as a system to detect contraband located, or even hidden, in a sample. However, the detector system 100 more generally may used to detect a target that is formed from any element, groups of elements or compounds, including any manufactured materials.

The samples to be analyzed for a particular target material such as contraband are passed through a sample area 10 which has parallel magnetic plates to form a resonance chamber. This resonance chamber performs enhanced magnetic resonance on the sample therein. The detector system 100 is divided into two stations, a detection station 20 and a processing station 30. The detection station 20 performs the necessary irradiation of the sample and subsequently receives the electromagnetic radiation emanating therefrom, which is then used to identify any of the target material present in the sample. The processing station 30, which may be remote from the detection station 20, performs the necessary spectroscopic and computational analysis on the radiation emanating from the sample.

The magnetic resonant generator 26 and the magnetic plates 28 provide a resonant field in the sample area 10. The magnetic plates 28 sweep the target in the sample area 10 so as to apply the correct amount of energy to efficiently resonate the target. The amount of energy that is necessary is dependent on the mass of the sample, which is determined in a known manner by detecting the electromagnetic waves reflected by the sample. Once the base frequency has been determined, the resonant generator 26 pulses the target at this frequency so that the target sympathetically resonates. This induced resonance results in micro-pore capillary pumping, which is a known process in which standing waves are generated between the molecules of the target, thus agitating the target material. Consequently, some of the molecules of the target will be dissociated from the sample and released into the sample area. This agitation of the target molecules effectively increases the vapor pressure of the target that is available for detection. Hence, micro-pore capillary pumping is particularly advantageous when attempting to detect low vapor pressure targets. The free molecules dissociated from the target contain sufficient unique information to identify the target.

The laser 24 performs two functions. First, immediately preceding the capillary pumping of the target, the laser 24 pulses the sample area 10 with radiation that pre-ionizes the area, in effect sterilizing the area so that signals from background molecules do not interfere with signals from the target molecules. Second, after the target has undergone micro-pore capillary pumping, a second pulse from the laser 24 ionizes the dissociated target molecules. As the ionized molecules de-excite, they emit a pattern of radiation that is unique to those molecules.

The radiation emitted from the ionized target molecules as they de-excite is detected by the sensor array 22. The sensor array 22 is a superconducting tunnel detector, which has an extremely high sensitivity in the submillimeter and millimeter range. It is at these frequencies that the target molecules emit their characteristic radiation by which they can be identified. The sensor array 22 is mounted within the detection station 20. The signals from the sensor array 22 are transmitted to a tunnel detector array interface 26, which is a protocol muxing-demuxing interface. The tunnel detector array interface 26 is digitally coupled to a mass spectrometer 32, which is located in the processing station 30.

The mass spectrometer 32 performs an analysis upon the signals from the sensor array 22 in a known manner. This analysis produces a frequency pattern of the radiation emitted by the ionized target molecules, indicating at each frequency within a given range of frequencies the relative intensity of the emitted radiation. The resulting digitized information is forwarded to central processing units 33 and 34, which contain a stored library of known target material patterns in look-up tables. The digitized information is compared to the patterns in the look-up tables until a match is found. Since the radiation emitted by every element, molecule, and compound has a unique, characteristic pattern, once a match has been found between the pattern from the sensor array 22 and a stored pattern, the target material has been identified. Furthermore, through the use of known field strength algorithms, the approximate quantity of the target material that is present in the sample can be calculated. When a predetermined concentration of the target material is detected, an alarm is activated or an indicator on a screen is displayed.

The detector system 100 may also be used to sense a target material that is not initially included in the look-up tables stored in the central processing units. This can be accomplished by running a known sample of the desired target material through the detector system 100 and then storing the resulting frequency pattern in the look-up tables of the central processing unit so that they can be subsequently used to detect unknown samples containing that particular target material. For example, it may be desirable to use the detector system 100 to detect counterfeit paper money, which uses unique ink and paper materials not found in authentic money. Thus, to detect counterfeit money, a known sample of counterfeit money is analyzed by the detector system and the results stored in the central processing unit. Hence, because of its simplicity and flexibility, the detector system 100 is a field-programmable unit that can be updated at its site of installation to detect any desired target material.

The above is a detailed description of a particular embodiment of the invention. The full scope of the invention is set out in the claims that follow and their equivalents. Accordingly, the claims and specification should not be construed to unduly narrow the full scope of protection to which the invention is entitled.

What Is claimed is:

1. A detector system for detecting a target material in a sample comprising: a resonance chamber containing the target for performing magnetic resonance thereon to form dissociated target molecules; a laser for pre-ionizing background material in the resonance chamber and for ionizing the dissociated target molecules; a sensor array detecting radiation emitted from the ionized target molecules; a mass spectrometer coupled to said sensor array analyzing signals from said sensor array to generate a frequency pattern of the target; and electronically stored data tables of known frequency patterns for comparing the frequency pattern of the target to the known frequency patterns until a match is determined.

2. The detection system of claim 1 wherein said sensor array comprises a superconducting tunnel detector.

3. A method for detecting a target material in a sample comprising the steps of:
   positioning the sample in a sample area;
   pre-ionizing the sample area with a first pulse of radiation from a laser;
   generating a resonant field in the sample area to determine a base resonant frequency of the target;
   pulsing the target with a resonant field at the base resonant frequency to generate dissociated target molecules;
   ionizing the dissociated target molecules with a second pulse of radiation from the laser;
   detecting energy emitted from the ionized target molecules to generate signals;
   analyzing the signals and generating a frequency pattern of the target; and
   comparing the frequency pattern of the target with known frequency patterns to determine the target identity.

4. The method of claim 3 wherein the step of pulsing the target with a resonant field further comprises the step of agitating the target molecules by micro-pore capillary pumping.

5. The method of claim 4 wherein the step of detecting energy emitted from the ionized target molecules comprises detecting the energy with a superconducting tunnel detector.

6. The method of claim 3 further comprising the steps of:
   determining that the frequency pattern of the target does not match known frequency patterns available in tables; and
   storing the frequency pattern of the target in the tables so that the target identity can be determined in subsequent samples.

7. The method of claim 5 further comprising the steps of:
   determining that the frequency pattern of the target does not match known frequency patterns available in tables; and
   storing the frequency pattern of the target in the tables so that the target identity can be determined in subsequent samples.

* * * * *